United States Patent [19]

McClintock

[11] Patent Number: 5,606,276
[45] Date of Patent: Feb. 25, 1997

[54] METHOD AND APPARATUS FOR CREATING A LARGE DELAY IN A PULSE IN A LAYOUT EFFICIENT MANNER

[75] Inventor: Cameron McClintock, Mountain View, Calif.

[73] Assignee: Altera Corporation, San Jose, Calif.

[21] Appl. No.: 319,381

[22] Filed: Oct. 5, 1994

[51] Int. Cl.[6] .......................... H03K 5/26; H03D 13/00
[52] U.S. Cl. .............................. 327/263; 327/8; 327/41; 327/49; 327/174; 327/24
[58] Field of Search .................................... 327/261, 263, 327/276, 269, 40, 39, 41–43, 23, 24, 47–49, 144, 145, 146, 164–166, 8, 12, 172–176, 291, 293, 294, 298; 331/49, 50; 377/47, 55, 51; 326/37–39

[56] References Cited

U.S. PATENT DOCUMENTS

| | | | |
|---|---|---|---|
| 3,609,311 | 5/1969 | Wayne | 377/49 |
| 3,956,704 | 5/1976 | Keeney, Jr. et al. | 331/49 |
| 4,115,687 | 9/1978 | Boese et al. | 377/49 |
| 4,678,949 | 7/1987 | Oshikiri et al. | 327/41 |
| 4,683,437 | 7/1987 | Javeri | 327/42 |
| 4,821,295 | 4/1989 | Sanner | 327/41 |
| 4,942,365 | 7/1990 | Satterwhite | 327/41 |
| 5,243,233 | 9/1993 | Cliff | 307/296.4 |
| 5,260,611 | 11/1993 | Cliff et al. | 307/465 |
| 5,375,086 | 12/1994 | Wahlstrom | 365/149 |

OTHER PUBLICATIONS

*Altera Data Book*, 1993, Chapter 7, pp. 341–348.

*Primary Examiner*—Timothy P. Callahan
*Assistant Examiner*—Eunja Shin
*Attorney, Agent, or Firm*—Townsend and Townsend and Crew, LLP

[57] ABSTRACT

A delay element (10) generates a delay pulse (OUT) the length of which is not dependent on an available system clock. The delay element uses oscillators (12a, 12b, 12c) and edge detectors (16a, 16b, 16c) to generate a delay based on the beat frequency of the oscillators. The delay element is suitable for fabrication as part of a CMOS integrated circuit, and requires less layout area than alternative methods.

24 Claims, 3 Drawing Sheets

5,606,276

METHOD AND APPARATUS FOR CREATING A LARGE DELAY IN A PULSE IN A LAYOUT EFFICIENT MANNER

BACKGROUND OF THE INVENTION

This invention relates to the field of electronic circuits. More particularly, this invention relates to an electronic circuit capable of generating a relatively long delay period and that can be incorporated into a CMOS integrated circuit using a small amount of chip area.

In integrated circuit digital design it is often desirable to generate a delay period or a timing pulse that is relatively very long when compared to the system clock signal used in the circuit. For example, digital CMOS circuits typically operate with system clocks measured in nanoseconds (ns). In some applications, it is desirable in such circuits to generate a delay which may be very long compared to the nanosecond clock rate, for example, a delay of several tens to several hundred milliseconds (ms). One application for such a delay may be in chip power up, where a chip, after power up, must delay any output signals it sends to other chips in the computer system so that it can be sure the other chips have had sufficient time to completely power up. Such a delay in a typical system might be 100 ms. If the chip's system clock is 10 ns, the desired delay of 100 ms will be 10,000,000 clock cycles.

Two known methods for generating such a large delay have proven particularly disadvantageous when applied to circuits fabricated with standard CMOS technology. One such method is the use of a counter circuit. Counter circuits have disadvantages in that the amount of delay they can generate is strictly limited by the size of the counter circuit and the clock driving the counter. For example, a 16 bit counter circuit operating in an electronic circuit that uses a clock of 10 ns could generate a maximum delay pulse of $2^{16}$ times 10 ns or 0.65 ms. Such a 16 bit counter bit circuit uses a relatively large amount of circuit layout area.

The second known method for generating a long delay pulse is the use of RC delay circuit. Fabrication of such a circuit using standard CMOS technology creates a problem in that the RC circuits require a very large resistor in order generate a delay pulse of sufficient length. This large resistor may be on the order of several tens to several hundred megaohms. The only practical way to manufacture such a large resistor in CMOS technology is to use large n well resistors, which require a large layout area. Use of large n well resistors also requires care to prevent parasitic transistors from forming between the large n well areas.

What is needed is an electronic circuit suitable for fabrication with CMOS technology capable of generating a delay pulse that is relatively long when compared to the clock frequency of the circuit and that uses a minimum of circuit layout area.

SUMMARY OF THE INVENTION

In accordance with the invention, two or more oscillator circuits are used, each having its own positive edge detector, to generate two or more different base frequencies. The invention compares the frequencies and generates a delay pulse from the resultant beat frequency that develops when the edges of the base frequencies are coincident in time. According to the invention, the beat period can be many times larger than the base oscillating periods. According to one embodiment of the invention, the oscillators are reset with a synchronization signal each time a beat pulse is generated so as to eliminate any undesired drift in the oscillators frequency from accumulating from one beat period to the next. This guarantees a beat pulse at a regular frequency. The invention will be better understood upon reference to the following detailed description and the accompanying figures.

One particular application for the invention is use in a programmable logic device (PLD) that performs self-configuration after power-up. For example, a PLD from the FLEX 8000 family made by Altera, assignee of the present invention, may in a typical system configure itself after power-up by reading data from a separate integrated circuit data storage chip, such as a serial EPROM. In some cases, the separate integrated circuit may take after system power up considerably longer than the PLD to become fully operational. In such a case, it is important that the PLD delay reading its configuration data from the EPROM for a period sufficient to ensure that the EPROM has fully powered-up. In a typical system, such a period may be on the order of 80 ms. According to the present invention, a PLD is provided with a long period delay circuit and that PLD will not read its configuration data until after expiration of the delay period. Such PLD systems are discussed in numerous coassigned U.S. patents including U.S. Pat. Nos. 5,258,668 and 5,260,611.

DESCRIPTION OF THE PREFERRED EMBODIMENT

Figure 1:
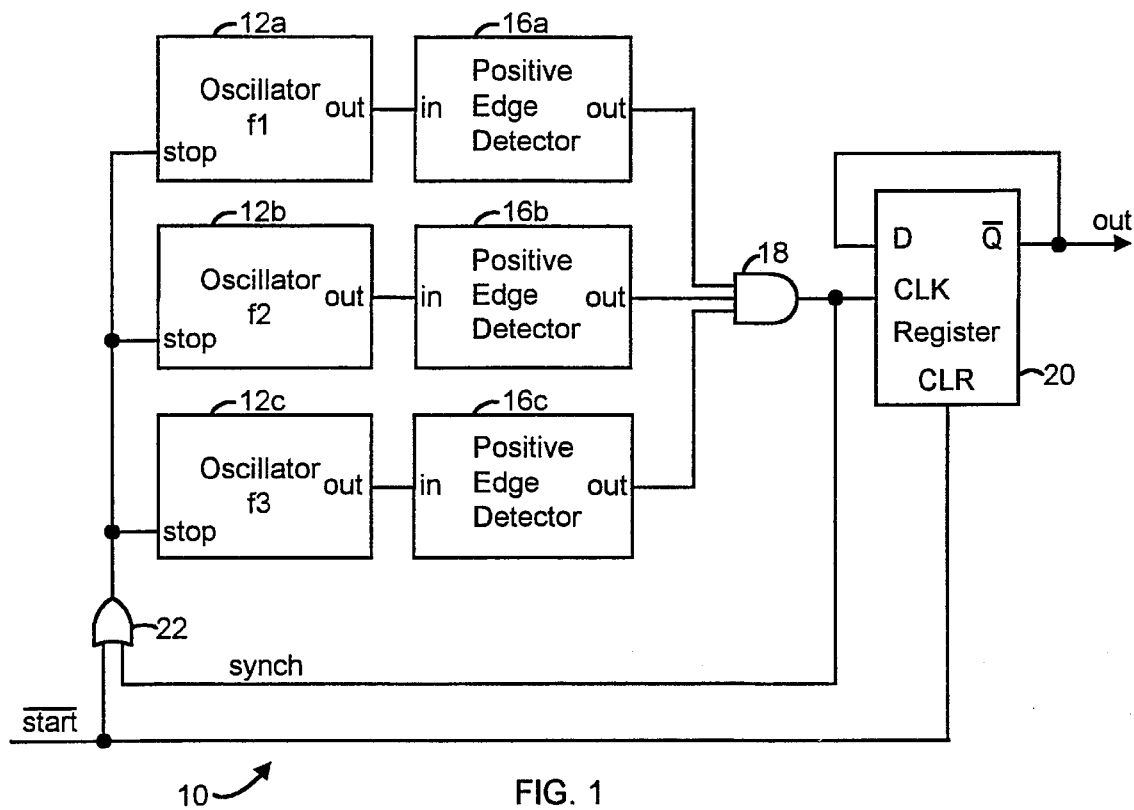
FIG. 1 is a block diagram of a delay circuit built according to one embodiment of the invention.

FIG. 1 is a block diagram of a delay element 10 according to one embodiment of the invention. Delay element 10 employs in this particular embodiment three oscillators 12a–c, each oscillator varying slightly in the frequency it outputs from the other oscillators. Each of the three oscillators are connected to positive edge detectors 16a–c that generate a narrow positive pulse at the positive edge of the oscillator output wave. Positive edge detectors 16a–c are combined by three input AND gate 18 such that the output of gate 18 is a positive pulse only when the positive edges generated by oscillators 12a–c occur at the "same" time within some known variance. The length of time between edge alignment of a plurality of frequency signals is referred to in the art as the "beat period," therefore the period of the output of gate 18 may be referred to as the beat period of oscillators 12a–c.

Gate 18 provides the clocking input for a register 20 whose output oscillates between high and low at a frequency equal to the beat period of the three oscillators. The oscillators 12a–c each have a stop input, which is controlled by the output of OR gate 22. Or gate 22 combines the signals SYNCH and the inverse of START. START is a pulse generated at, for example, power up of a chip. The inverse START signal, when high, stops the oscillators 12a–c and when taken low insures that the oscillators 12a–c will be synchronized as they begin oscillating. The SYNCH pulses high when the beat frequency is reached and this re-synchronizes the oscillators. This is done to insure that any undesired drift in the oscillator frequencies does not accumulate from one beat period to successive ones.

While the invention is illustrated with respect to an AND gate 18 and register 20, other implementations will be apparent to those of skill in the art. For example, gate 18 could be replaced with a NAND gate or other logic circuit. Still further delay may be introduced by providing the output of AND gate 18 to a counter circuit of the type known in the art. While the circuit as shown in FIG. 1 uses positive edge detectors, the invention may also be implemented with 16a–c being negative edge detectors that produce a negative pulse at negative edge alignment, in which case gate 18 could be a three input NOR gate. Other logically equivalent implementations are possible.

Figure 2:
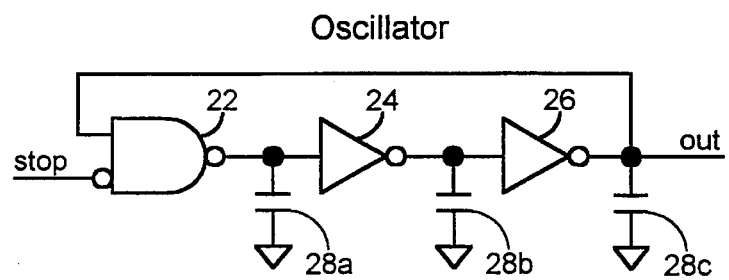
FIG. 2 is a schematic of one of the oscillators used in the delay circuit of FIG. 1.

FIG. 2 is a schematic representation of an oscillator design that could be used for one of the oscillators 12 in a delay circuit built according to the present invention. The oscillator contains a NAND gate 22, with one inverted input, connected to an inverter 24, which is connected to an inverter 26, which feeds back into the non-inverted input of NAND gate 22. Capacitors 28a–c are connected to the outputs of each of the three gates 22, 24, and 26, to create an oscillating period in a manner well understood in the art. In an actual circuit implementation of the invention, each oscillator would contain several dozen inverters in series with capacitors connected at their outputs as shown in the figure, with the number of inverters in each oscillator differing by a small percentage, perhaps each oscillator having two more inverters than the previous.

The particular oscillator circuit shown in FIG. 2 is illustrated by way of example, and any other known means for generating an oscillating signal may be employed in the invention for oscillators 12a–c. Of the variety of designs well-known in the art for constructing oscillators 12a–c, a preferable design will have a easily variable component, such as a number of inverters in series, to allow for generation of slightly different, non-harmonic frequencies.

Figure 3A:
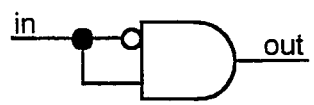
FIG. 3A is a schematic of one positive edge detector used in the circuit pictured in FIG. 1.

FIG. 3A is a schematic of one of the positive edge detectors 16 used in one specific embodiment of the invention. As can be seen in the figure, the positive edge detector consists of an AND gate with one of its inputs inverted and both of its inputs connected to the signal IN from oscillator 12. The delay through the inverted input of the AND gate causes a short positive pulse on line OUT when the signal IN goes from low to high.

Figure 3B:
FIG. 3B is a schematic of an example of a negative edge detector.

FIG. 3B is a schematic of a negative edge detector which may be used for edge detector 16 in an alternative embodiment of the invention.

Figure 4:
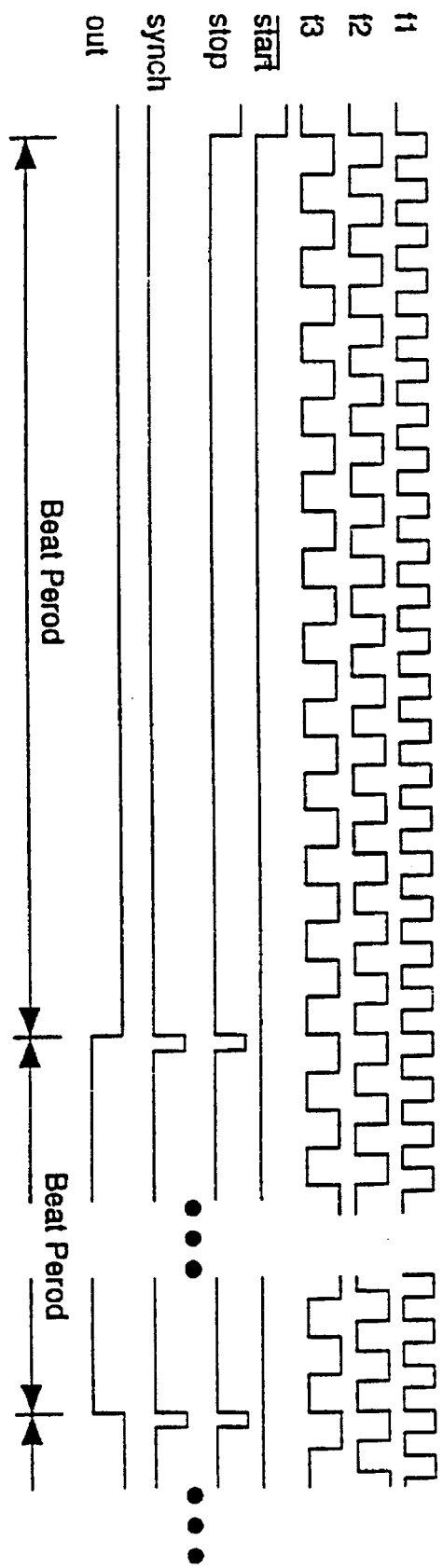
FIG. 4 is a timing diagram illustrating the generation of a beat period from three oscillators which differ slightly in their oscillation frequencies.

FIG. 4 is a timing diagram illustrating operation of one specific embodiment of the invention. As shown in FIG. 4, oscillator frequencies f1, f2, and f3 commence when the signals START and STOP are both low. Oscillating frequencies f1, f2, and f3 differ slightly in their frequency and therefore generate a resulting beat frequency when their edges are coincident in time. This beat frequency is indicated by the signal SYNCH and the signal OUT.

While the signals illustrated in FIG. 4 are square waves and while detectors 16a–c are designated as edge detectors, it will be apparent to one having skill in the art that the invention could be implemented where signals f1–3 were any periodic signal, such as a sine wave, and where detectors 16a–c detected the phase of the signals and gate 18 detected phase alignment rather than edge alignment.

Figure 5:
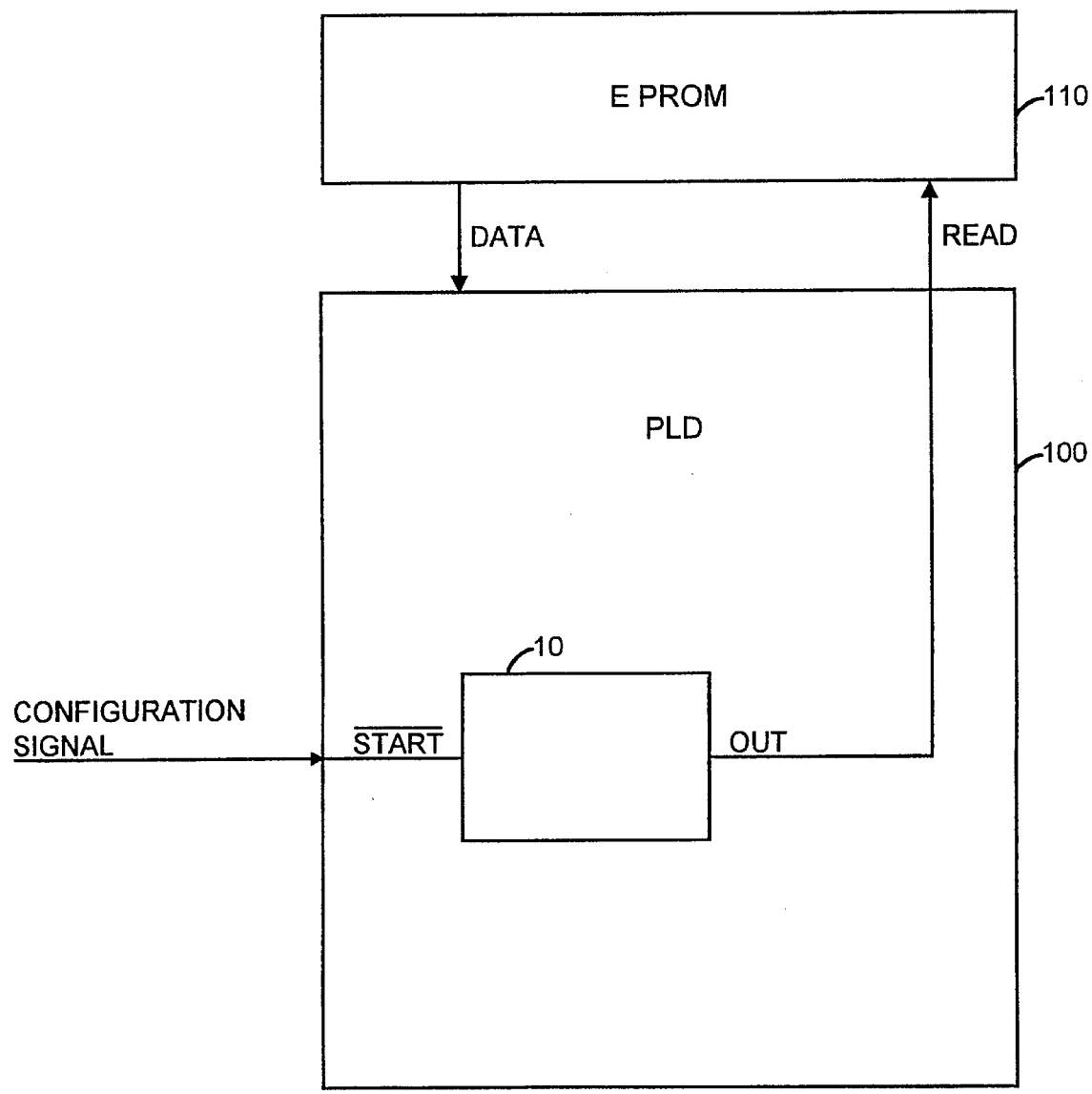
FIG. 5 is a block diagram illustrating a delay circuit according to an embodiment of the invention generating a configuration signal to an EPROM.

FIG. 5 illustrates a system allowing for configuring a programmable logic device (PLD) 100. PLD 100 receives a configuration signal 105 and uses that configuration signal to initiate oscillators contained in delay circuit 10 as described above. These oscillator each have a different characteristic period as discussed above. Delay circuit 10 as described above includes circuits to detect the edges of the oscillators and when the edges of the oscillators are substantially coincident in time as discussed above, and generates a signal indicative thereof. PLD 100 uses the generated signal to initiate a read operation to an external data storage integrated circuit 110. In response to that read operation, PLD 100 receives configuration data from data storage circuit 110 and uses that received data to configure itself as in known in the art.

The invention has now been explained with reference to specific embodiments. Other embodiments will be obvious to those of ordinary skill in the art. One possible modification is that a different number of oscillators may be used. A number larger than three may be employed to create still longer delay pulse. Therefore, it is intended that the invention not be limited by the disclosure of specific embodiments but only be limited to the extent as described in the attached claims.

What is claimed is:

1. A circuit for generating a long delay pulse comprising:

at least two oscillators, each having a different characteristic period, each oscillator generating a periodic signal having periodic positive and negative edges, each coupled to one of;

at least two edge detectors, operatively connected to;

a comparator coupled to the edge detectors for detecting when edges of the periodic signals generated by each of the oscillators are coincident in time, operatively connected to;

an output signal generator for generating a long delay pulse, said long delay pulse having a period many times longer than any of said different characteristic periods of said at least two oscillators an initiator input for initiating the oscillators; and a reset input for resynchronizing the oscillators when edges of said periodic signals are coincident in time.

2. The apparatus according to claim 1 wherein said circuit is fabricated as part of a CMOS integrated circuit.

3. The apparatus according to claim 1 wherein each of said oscillators comprises:

a plurality of inverters connected in series, the output of each inverter having a capacitive load, said plurality comprising an odd number of invertors; and a circuit for combining the output signal of said series of inverters with a control signal, the output of said circuit for combining connected to the input of said series.

4. The apparatus according to claim 3 wherein each of said at least two oscillators differs from each of said other oscillators by having a different number of inverters in said series.

5. The apparatus according to claim 3 wherein each of said at least two oscillators differs from each of said other oscillators by having a different capacitive load on the inverters in said series.

6. The apparatus according to claim 3 wherein said at least two oscillators comprise at least three oscillators and wherein said at least two edge detectors comprise at least three edge detectors.

7. The apparatus according to claim 1 wherein said edge detectors detect positive going edges.

8. The apparatus according to claim 1 wherein said comparator comprises an AND gate.

9. The apparatus according to claim 1 wherein said edge detectors each comprise an AND gate with one inverted input.

10. The apparatus according to claim 1 wherein said edge detectors detect negative going edges.

11. The apparatus according to claim 1 wherein said edge detectors comprise an OR gate with one inverted input.

12. The apparatus according to claim 1 wherein said edge detectors each comprise an OR gate.

13. The apparatus according to claim 3 wherein said circuit is fabricated as part of a CMOS integrated circuit.

14. A circuit for generating a low frequency periodic signal comprising:

at least two oscillators for generating a plurality of oscillating signals, each said oscillator having a characteristic period, each characteristic period different from that of each other characteristic period;

at least two phase detectors for detecting the phase of said signals;

a beat frequency detector for determining when the phases of each of said signals are coincident; and a circuit for generating a signal whose value changes between a first state and a second state in response to said beat frequency detector, said signal having a period many times longer than any of said different characteristic periods of said at least two oscillators and an initiator input for initiating said at least two oscillators; and a reset input for resetting said at least two oscillators.

15. A method for generating a long delay in and an output signal comprising the steps of:

using an input signal to initiate at least two oscillators, each of said oscillators generating an output wave, each of said output waves having a different characteristic period;

detecting the phases of said output waves;

detecting when the phases of said output waves are coincident; and in response to said detecting generating said output signal, said output signal having a period many times longer than any of said different characteristic periods of said at least two oscillators.

16. A method for generating a long delay in an output signal comprising the steps of:

using an input signal to initiate at least two oscillators, each oscillator having a different characteristic period, each oscillator generating a periodic signal having periodic positive and negative edges;

detecting edges of the oscillators;

detecting when edges of the oscillators are coincident in time and generating a signal indicative thereof;

using the generated signal to trigger a flip-flop;

using the output signal of the flip-flop as the delayed output signal.

17. A method for configuring a programmable logic device comprising the steps of:

receiving a configuration signal at said programmable logic device;

using said configuration signal to initiate at least two oscillators, each oscillator having a different characteristic period, each oscillator generating a periodic signal having periodic positive and negative edges;

detecting edges of the oscillators;

detecting when edges of the oscillators are substantially coincident in time and generating a signal indicative thereof said signal having a period many times longer than any of said different characteristic periods of said at least two oscillators;

using the generated signal to initiate a read operation to an external data storage integrated circuit;

receiving configuration data from said data storage circuit; and using said received data to configure said programmable logic device.

18. The method according to claim 17 wherein said configuration signal is a signal indicating system power-up.

19. The method according to claim 17 wherein said data storage circuit is an EPROM.

20. (Allowed) A circuit for generating a long delay pulse comprising:

three oscillators, each having a characteristic period different from the other two and each connected to one of;

three edge detectors, with outputs connected to;

a three input AND gate for detecting when the edges of each of the oscillators are coincident in time;

a flip-flop with a clock input connected to the output of said three input AND gate and a clear input connected to a START signal; and an OR gate for combining the output of said three input AND gate and Said START signal, the output of said OR gate connected to a stop input on each of said oscillators for resetting said oscillators.

21. A circuit for generating a long delay pulse comprising:

at least three oscillators, each having a different characteristic period, each oscillator generating a periodic signal having periodic positive and negative edges, each coupled to one of;

at least three edge detectors, operatively connected to;

a comparator coupled to the edge detectors for detecting when edges of each of the oscillators are coincident in time, operatively connected to;

an output signal generator;

an initiator input for initiating the oscillators; and a reset input for resynchronizing the oscillators when edges of each are coincident in time.

22. The apparatus according to claim 21 wherein said circuit is fabricated as part of a CMOS integrated circuit.

23. The apparatus according to claim 21 wherein said edge detectors detect positive going edges.

24. The apparatus according to claim 21 wherein said comparator comprises an AND gate.

* * * * *